US006287932B2

(12) United States Patent
Forbes et al.

(10) Patent No.: US 6,287,932 B2
(45) Date of Patent: Sep. 11, 2001

(54) INDUCTOR WITH MAGNETIC MATERIAL LAYERS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/789,146

(22) Filed: Feb. 20, 2001

Related U.S. Application Data

(62) Division of application No. 09/243,584, filed on Feb. 3, 1999, now Pat. No. 6,191,468.

(51) Int. Cl.$^7$ .................................................. H01L 21/20
(52) U.S. Cl. ........................... 438/381; 438/3; 438/238; 438/385
(58) Field of Search ..................... 438/381, 385, 438/3, 238; 257/531

(56) References Cited

U.S. PATENT DOCUMENTS

| | | | |
|---|---|---|---|
| 4,969,032 | 11/1990 | Scheitlin et al. | 257/531 |
| 5,227,659 | 7/1993 | Hubbard | 257/531 |
| 6,013,939 | 1/2000 | El-Sharawy et al. | 257/531 |
| 6,069,397 | 5/2000 | Cornett et al. | 257/531 |

FOREIGN PATENT DOCUMENTS 9186291A  7/1997  (JP) .............................. H01L/27/04

OTHER PUBLICATIONS

Dhara, S., et al., "Direct Deposit of highly coercive gamma iron oxide thin films for magnetic recording", *Journal of Applied Physics*, 74 (11), pp. 7019–7021, (Dec. 1993).

Dimitrov, D.V., et al., "Stoichiometry and Magnetic Properties of Iron Oxide Films,", Materials Research Society Symposium Proceedings, 494, pp. 89–94, (1998).

Kim, Y., et al., "Surface Micromachined Solenoid Inductors for High Frequency Applications", 1997 International Symposium on Miicroelectronics, 1–6, (1997).

Lin, J.K., et al., "Properties of RF Sputtered Iron Oxide Thin Films With CoCr and Nb as Dopants", *IEEE Transactions on Magnetics*, 21 (5), pp. 1462–1464, (Sep. 1985).

Ouyang, M., et al., "Structure and Magnetic Properties of Iron Oxide Films Deposited by Excimer Laser Ablation of a Metal–Containing Polymer", *Material Research Bulletin*, 32 (8), pp. 1099–1107, (1997).

Park, J.Y., et al., "Ferrite–Based Integrated Planar Inductor and Transformers Fabricated at Low Temperature", *IEEE Transactions on Magnetics*, 33 (5), pp. 3322–3324, (Sep. 1997).

Park, J.Y., et al., "Fully Integrated Micromachined Inductors with Electroplated Anisotropic Magnetic Cores", Thirteenth Annual Applied Power Electronics Conference and Exposition, vol. 1, Conference Proceedings, Anaheim, California, 379–385, (1998).

*Primary Examiner*—Charles Bowers
*Assistant Examiner*—Yennhu B. Huynh
(74) *Attorney, Agent, or Firm*—Schwegman, Lundberg, Woessner & Kluth, P.A.

(57) ABSTRACT

A spiral inductor fabricated above a semiconductor substrate provides a large inductance while occupying only a small surface area. Including a layer of magnetic material above and below the inductor increases the inductance of the inductor. The magnetic material also acts as barrier that confines electronic noise generated in the spiral inductor to the area occupied by the spiral inductor. Inductance in a pair of stacked spiral inductors is increased by including a layer of magnetic material between the stacked spiral inductors.

48 Claims, 4 Drawing Sheets

INDUCTOR WITH MAGNETIC MATERIAL LAYERS

This application is a Divisional of U.S. application Ser. No. 09/243,584 filed Feb. 3, 1999 in U.S. Pat. No. 6,191,468.

FIELD OF THE INVENTION

The present invention relates to inductors, and particularly to inductors used in integrated circuits.

BACKGROUND OF THE INVENTION

The telecommunications and computer industries are driving the demand for miniaturized analog and mixed signal circuits. Inductors are a critical component in the traditional discrete element circuits, such as impedence matching circuits, resonant tank circuits, linear filters, and power circuits, used in these industries. Since traditional inductors are bulky components, successful integration of the traditional discrete element circuits requires the development of miniaturized inductors.

One approach to miniaturizing an inductor is to use standard integrated circuit building blocks, such as resistors, capacitors, and active circuitry, such as operational amplifiers, to design an active inductor that simulates the electrical properties of a discrete inductor. Active inductors can be designed to have a high inductance and a high Q factor, but inductors fabricated using these designs consume a great deal of power and generate noise.

A second approach to miniaturizing an inductor is to fabricate a solenoid type inductor with a core using conventional integrated circuit manufacturing process technology. Unfortunately, conventional integrated circuit process steps do not lend themselves to precisely and inexpensively fabricating a helical structure with a core. So, integrated circuit process technology is only marginally compatible with manufacturing a solenoid type inductor.

A third approach, sometimes used in the fabrication of miniature inductors in gallium arsenide circuits, is to fabricate a spiral type inductor using conventional integrated circuit processes. Unfortunately, this approach has a high cost factor associated with it when applied to fabricating inductors for use in silicon integrated circuits. Silicon integrated circuits operate at lower frequencies than gallium arsenide circuits, and generally require inductors having a higher inductance than inductors used in gallium arsenide circuits. The higher inductance is realized in a spiral inductor occupying a large surface area on the silicon substrate.

For these and other reasons there is a need for the present invention.

SUMMARY OF THE INVENTION

In one embodiment of the invention, an inductor comprises layers of material deposited on a silicon substrate. First, a layer of magnetic material is deposited on the silicon substrate. Next, an insulating layer is deposited on the magnetic material layer. An inductor pattern is deposited on the insulating layer and above the magnetic material layer. Finally, a second insulating layer is deposited on the inductor pattern, and a second magnetic material layer is deposited on the second insulating layer. The second magnetic material layer is deposited above the inductor pattern.

In an alternate embodiment, the inductor described above is coupled to another electronic device in an integrated circuit.

In still another embodiment, a plurality of sandwich structures are vertically stacked on an insulating layer that is deposited on a layer of magnetic material. The layer of magnetic material is deposited on a silicon substrate. The sandwich structures include an inductor pattern, an insulating layer deposited on the inductor pattern, a layer of magnetic material deposited on the insulating layer and above the inductor pattern, and an insulating layer deposited on the magnetic material layer. The structures also include a conducting path through the structures, such that each inductor pattern is serially connected to the inductor pattern above by the conducting path. The current flowing in the serially connected inductor patterns creates a reinforcing magnetic field in the magnetic material between adjacent inductor patterns.

In still another embodiment, a method of fabricating an inductor comprises a series of steps. First, a silicon substrate is selected, a layer of magnetic material is deposited on the substrate, and an insulating layer is deposited on the magnetic material layer. Next, a plurality of sandwich structures are stacked on the insulating layer. The method of fabricating the structures comprises the steps of depositing an inductor pattern on the insulating layer and above the magnetic material layer, depositing an insulating layer on the inductor pattern, depositing a layer of magnetic material on the insulating layer and above the inductor pattern, and depositing an insulating layer on the magnetic material layer. Finally, a conducting path is fabricated through the structures to connect each inductor pattern serially to the inductor pattern above, such that a current flowing in the serially connected inductor patterns creates a reinforcing magnetic field in the magnetic material between adjacent inductor patterns.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Inductors intended for use in circuits fabricated on a silicon substrate usually operate at lower frequencies and require larger inductances than inductors intended for use in circuits fabricated on a gallium arsenide substrate. As mentioned above, a larger inductance is usually realized in silicon by having the inductor occupy a larger surface area. According to one embodiment of the present invention, rather than increasing the inductance by increasing the surface area occupied by the inductor, a larger inductance is achieved by adding a layer of magnetic material to the inductor.

Figure 1A:
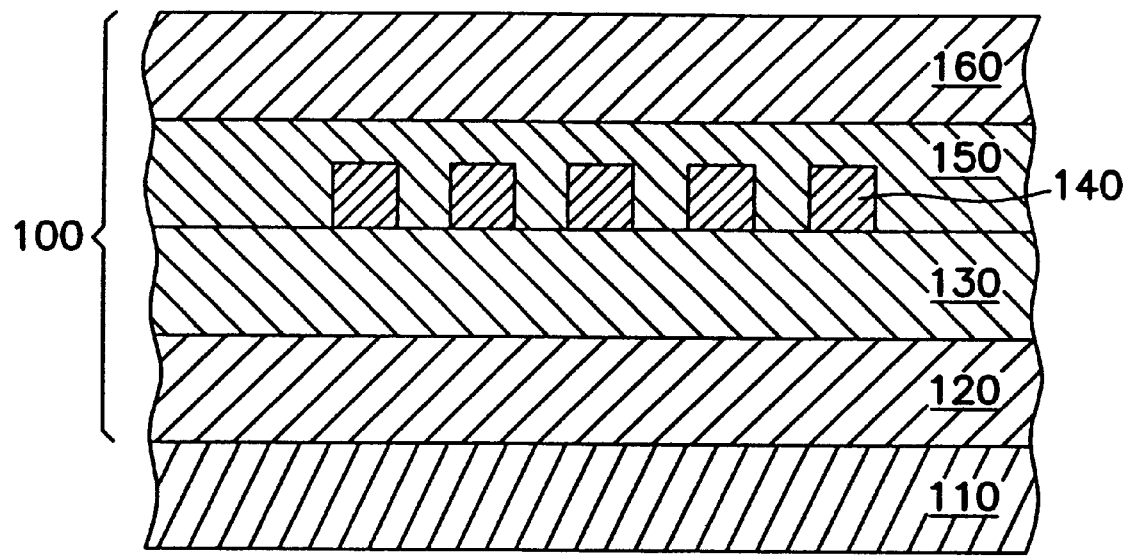
FIG. 1A is a cross-sectional view of one embodiment of a square spiral inductor embedded in a solid state structure.

Referring to FIG. 1A, a cross-sectional view of one embodiment of a square spiral inductor of the present invention is shown. Inductor 100 is formed on substrate 110 and comprises magnetic material layer 120, insulating layer 130, inductor pattern 140, second insulating layer 150, and second magnetic material layer 160. Magnetic material layer 120 is deposited on substrate 110, insulating layer 130 is deposited on magnetic material layer 120, inductor pattern 140 is deposited on insulating layer 130, second insulating layer 150 is deposited on inductor pattern 140, and second magnetic material layer 160 is deposited on second insulating layer 150.

Substrate 110, in one embodiment, is a semiconductor, and even though the invention is not limited to a particular type of semiconductor, silicon is the preferred semiconductor substrate material.

Magnetic material layer 120, in one embodiment, is deposited on the surface of substrate 110. The particular magnetic material selected for use in a particular inductor design depends on the inductance requirement. In one embodiment, in which a large inductance in a small volume is desired, a high permeability ferromagnetic material, such as pure iron or a NiFe alloy is selected. An example of a high permeability NiFe alloy is an alloy of 81% Ni and 19% Fe. Electrically conducting films, such as an insulating magnetic oxide film, may also be suitable for use in the present invention.

Insulating layer 130 is deposited on magnetic material layer 120. In one embodiment, insulating layer 130 is an inorganic silicon oxide film. In an alternate embodiment, insulating layer 130 is silicon dioxide. In still another embodiment, which is perhaps preferable in a low temperature processing environment, insulating layer 130 is an organic insulator, such as parylene and polyimide.

Figure 1B:
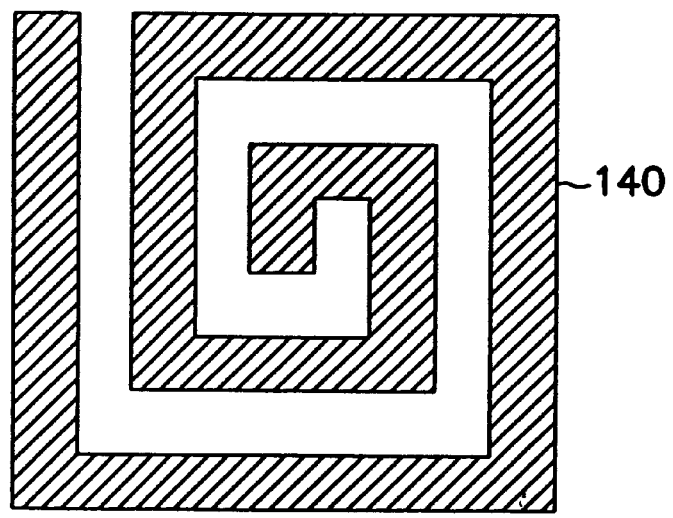
FIG. 1B is a top view of one embodiment of a square spiral inductor pattern.

Inductor pattern 140 is deposited on insulating layer 130. In one embodiment, inductor pattern 140 is a spiral. In an alternate embodiment, inductor pattern 140 is a circular spiral. In a second alternate embodiment, inductor pattern 140 is a polygonal spiral, where the polygonal spiral may be in the shape of a triangle, square, rectangle, octagon, or hexagon. A square spiral inductor pattern, which is shown as inductor pattern 140 in FIG. 1B, is preferred, since it is easy to manufacture. Inductor pattern 140 is fabricated from a high-conductivity material. In one embodiment the high-conductivity material is gold. In an alternate embodiment, the high-conductivity material is copper.

Referring to FIG. 1A, second insulating layer 150 is deposited on inductor pattern 140, and is fabricated from the same materials as insulating layer 130.

Second magnetic material layer 160 is deposited on second insulating layer 150, and is fabricated from the same materials as magnetic material layer 120. Second magnetic material layer 160 is preferably located above inductor pattern 140, and second magnetic material layer 160 does not intersect the plane of magnetic material layer 160.

Locating magnetic material layer 160 above inductor pattern 140 allows the contribution of the magnetic material to the inductance of the inductor to be precisely controlled during the manufacturing process. The thickness of the layer of magnetic material along with the magnetic properties of the material define the contribution of the layer to the inductance of the inductor. Once the properties of the material are established during the preparation of the material, the thickness of the layer, which can be precisely controlled in an integrated circuit manufacturing process, defines the contribution of the layer of magnetic material to the inductance.

In one embodiment, the inductor of the present invention is connected to other electronic devices in an integrated circuit. The inductor of the present invention is compatible with conventional silicon manufacturing processes. Structures for coupling passive devices, such as inductors, to other integrated circuit devices are known in the art.

Figure 2:
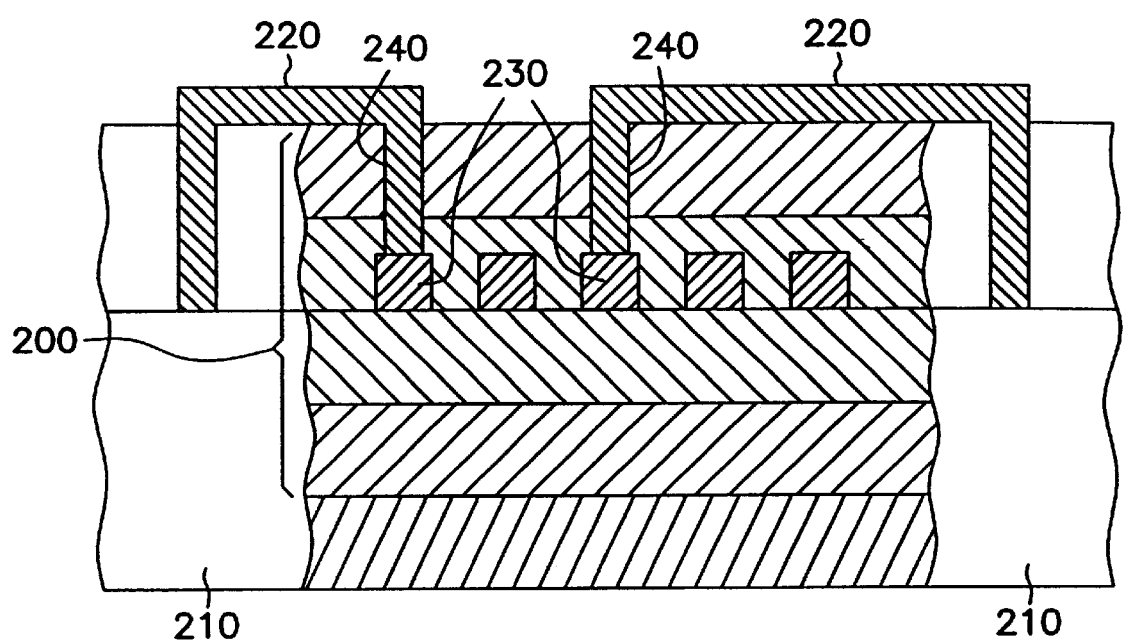
FIG. 2 is a cross-sectional view one embodiment of an inductor coupled to another electronic device in an integrated circuit.

Referring to FIG. 2, inductor 200 is coupled to device 210. The coupling is accomplished by providing conducting path 220 from inductor pattern 230, through vias 240, to device 210.

Figure 3A:
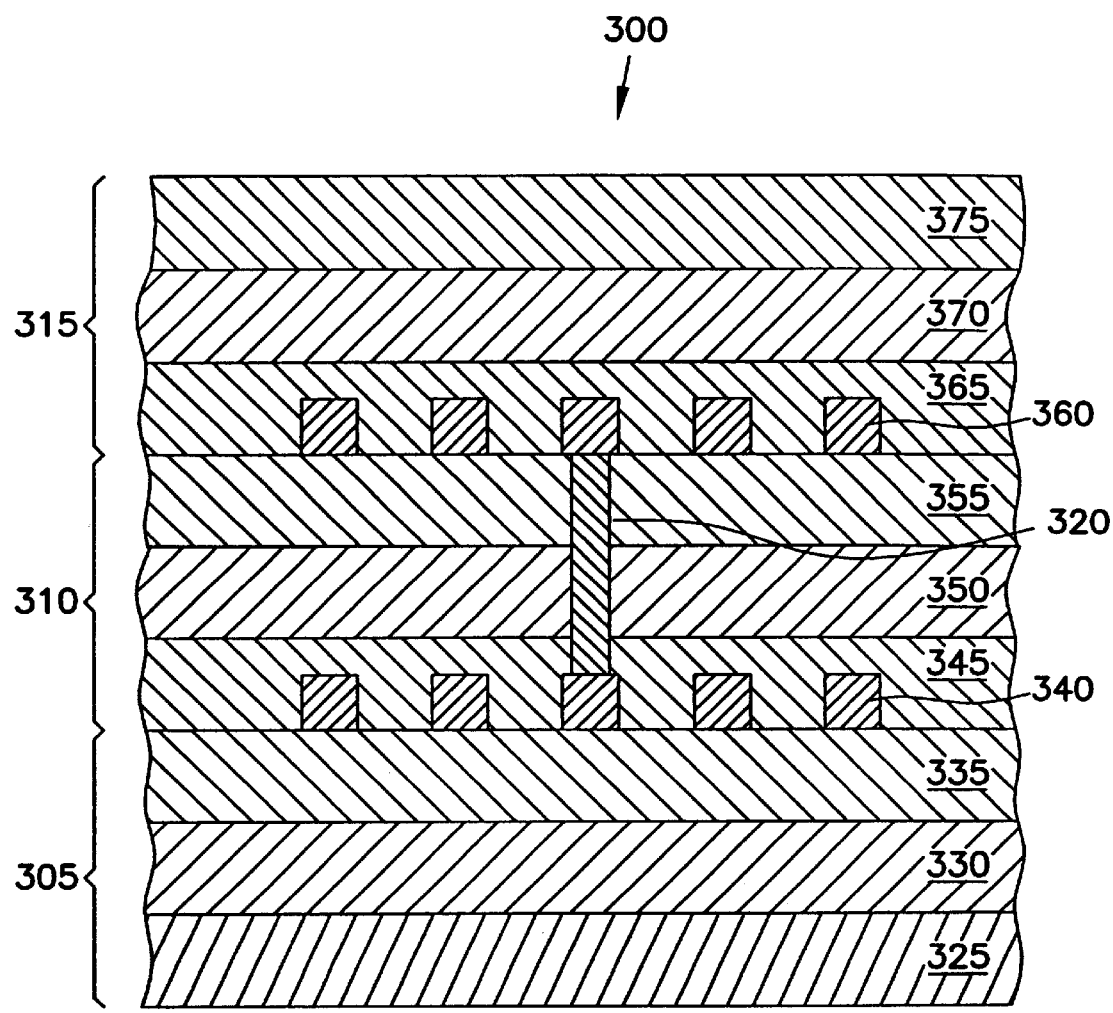
FIG. 3A is a cross-sectional view of one embodiment of two vertically stacked inductors.

Referring to FIG. 3A, one embodiment of inductor structure 300, which combines two inductors, is shown. Inductor structure 300 comprises base structure 305, sandwich structure 310, second sandwich structure 315, and conducting path 320. Base structure 305 includes substrate 325, magnetic material layer 330, and insulating layer 335. Sandwich structure 310 includes inductor pattern 340, insulating layer 345, magnetic material layer 350, and insulating layer 355. Second sandwich structure 315 is stacked on sandwich structure 310. Second sandwich structure 315 includes inductor pattern 360, insulating layer 365, magnetic material layer 370, and insulating layer 375.

Conducting path 320 couples sandwich structure 310 to second sandwich structure 315, and serially connects inductor pattern 340 to inductor pattern 360. A current flowing in the serially connected inductor patterns creates a reinforcing magnetic field in magnetic material layer 350. Magnetic material layers 330 and 370 are located below inductor pattern 340 and above inductor pattern 360, respectively. Magnetic material layers 330 and 370 confine the magnetic flux and noise radiated by a current flowing in inductor pattern 340 and inductor pattern 360 to the area bounded by the outer surfaces of magnetic material layers 330 and 370. By stacking sandwich structures, in one embodiment, a large inductance can be created without increasing the surface area on a substrate occupied by the inductor.

Figure 3B:
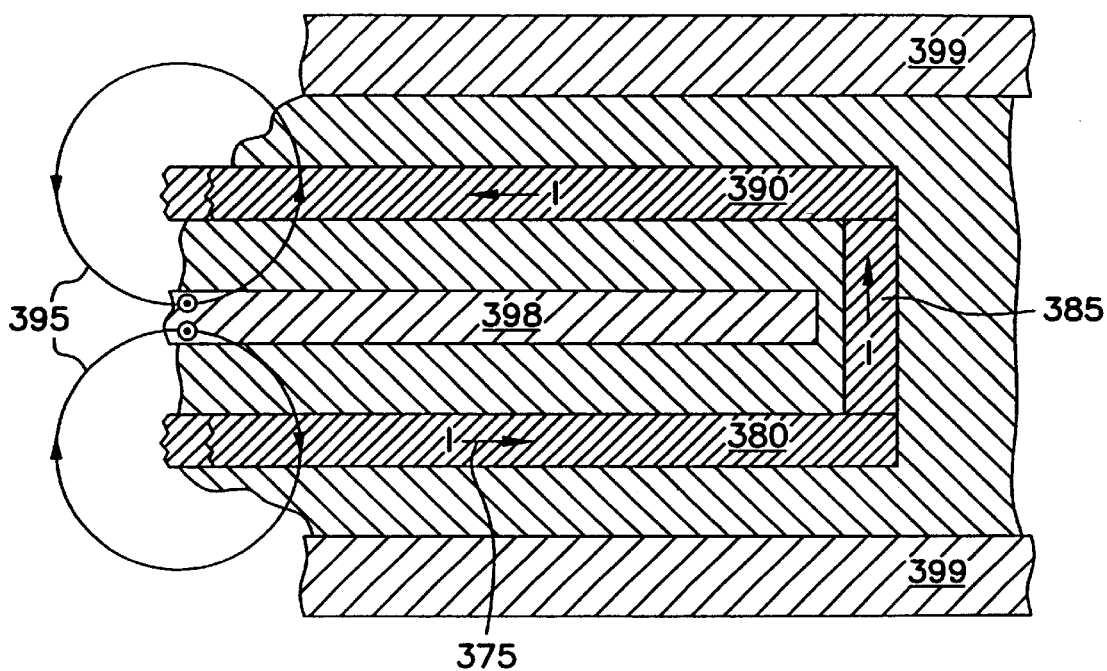
FIG. 3B is a cross-sectional view of one embodiment of two stacked and serially connected inductors showing the current in the inductors and the resulting magnetic field lines.

Referring to FIG. 3B, a diagram showing the currents and the resulting reinforcing magnetic fields of the two inductor sandwich of FIG. 3A is shown. Current 375 flows in inductor pattern 380, in conducting path 385, and in inductor pattern 390. The resulting magnetic field lines 395 are shown as reinforcing each other in magnetic material 398, which corresponds to magnetic material layer 350 in FIG. 3A. Magnetic field lines 395 are confined by magnetic material barrier layers 399.

It is to be recognized that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A method of fabricating an inductor comprising:
   selecting a substrate;
   depositing a layer of magnetic material on the substrate;

depositing an insulating layer on the magnetic material layer;

depositing an inductor pattern on the insulating layer;

depositing a second insulating layer on the inductor pattern; and depositing a second magnetic material layer on the second insulating layer.

2. The method of claim 1, wherein the substrate is a semiconductor.

3. The method of claim 1, wherein the magnetic material is a ferromagnetic.

4. The method of claim 1, wherein the insulating layer is silicon dioxide.

5. The method of claim 1, wherein the inductor pattern is a square spiral.

6. The method of claim 1, wherein the inductor pattern is a high-conductivity material.

7. A method of fabricating an inductor comprising:

selecting a substrate;

depositing a layer of magnetic material on the substrate;

depositing an insulating layer on the magnetic material layer;

depositing an inductor pattern on the insulating layer and above the magnetic material layer;

depositing a second insulating layer on the inductor pattern; and depositing a second magnetic material layer on the second insulating layer.

8. The method of claim 7, wherein the substrate is a semiconductor.

9. The method of claim 7, wherein the magnetic material is a ferromagnetic.

10. The method of claim 7, wherein the insulating layer is silicon dioxide.

11. The method of claim 7, wherein the inductor pattern is a square spiral.

12. The method of claim 7, wherein the inductor pattern is a high-conductivity material.

13. A method of fabricating an inductor comprising:

selecting a substrate;

depositing a layer of magnetic material on the substrate;

depositing an insulating layer on the magnetic material layer;

depositing an inductor pattern on the insulating layer;

depositing a second insulating layer on the inductor pattern; and depositing a second magnetic material layer on the second insulating layer above the inductor pattern.

14. The method of claim 13, wherein the substrate is a semiconductor.

15. The method of claim 13, wherein the magnetic material is a ferromagnetic.

16. The method of claim 13, wherein the insulating layer is silicon dioxide.

17. The method of claim 13, wherein the inductor pattern is a square spiral.

18. The method of claim 13, wherein the inductor pattern is a high-conductivity material.

19. A method of fabricating an inductor comprising:

selecting a silicon substrate;

depositing a layer of magnetic material on the substrate;

depositing an insulating layer on the magnetic material layer;

depositing an inductor pattern on the insulating layer and above the magnetic material layer;

depositing a second insulating layer on the inductor pattern; and depositing a second magnetic material layer on the second insulating layer and above the inductor pattern.

20. The method of claim 19, wherein the substrate is a semiconductor.

21. The method of claim 19, wherein the magnetic material is a ferromagnetic.

22. The method of claim 19, wherein the insulating layer is silicon dioxide.

23. The method of claim 19, wherein the inductor pattern is a square spiral.

24. The method of claim 19, wherein the inductor pattern is a high-conductivity material.

25. A method of fabricating an inductor comprising:

selecting a substrate;

depositing a layer of magnetic material on the substrate;

depositing an insulating layer on the magnetic material layer;

stacking a plurality of sandwich structures on the insulating layer, the method of fabricating the structures comprising:

depositing an inductor pattern on the insulating layer;

depositing an insulating layer on the inductor pattern;

depositing a layer of magnetic material on the insulating layer; and depositing an insulating layer on the magnetic material layer;

fabricating a conducting path through the structures; and connecting each inductor pattern serially to the inductor pattern above by the conducting path, such that a current flowing in the serially connected inductor patterns creates a reinforcing magnetic field in the magnetic material between adjacent inductor patterns.

26. The method of claim 25, wherein the substrate is a semiconductor.

27. The method of claim 25, wherein the magnetic material is a ferromagnetic.

28. The method of claim 25, wherein the insulating layer is silicon dioxide.

29. The method of claim 25, wherein the inductor pattern is a square spiral.

30. The method of claim 25, wherein the inductor pattern is a high-conductivity material.

31. A method of fabricating an inductor comprising:

selecting a substrate;

depositing a layer of magnetic material on the substrate;

depositing an insulating layer on the magnetic material layer;

stacking a plurality of sandwich structures on the insulating layer, the method of fabricating the structures comprising:

depositing an inductor pattern on the insulating layer and above the magnetic material layer;

depositing an insulating layer on the inductor pattern;

depositing a layer of magnetic material on the insulating layer; and depositing an insulating layer on the magnetic material layer;

fabricating a conducting path through the structures; and connecting each inductor pattern serially to the inductor pattern above by the conducting path, such that a current flowing in the serially connected inductor patterns creates a reinforcing magnetic field in the magnetic material between adjacent inductor patterns.

32. The method of claim 31, wherein the substrate is a semiconductor.

33. The method of claim 31, wherein the magnetic material is a ferromagnetic.

34. The method of claim 31, wherein the insulating layer is silicon dioxide.

35. The method of claim 31, wherein the inductor pattern is a square spiral.

36. The method of claim 31, wherein the inductor pattern is a high-conductivity material.

37. A method of fabricating an inductor comprising:
  selecting a substrate;
  depositing a layer of magnetic material on the substrate;
  depositing an insulating layer on the magnetic material layer;
  stacking a plurality of sandwich structures on the insulating layer, the method of fabricating the structures comprising:
    depositing an inductor pattern on the insulating layer;
    depositing an insulating layer on the inductor pattern;
    depositing a layer of magnetic material on the insulating layer and above the inductor pattern; and
    depositing an insulating layer on the magnetic material layer;
  fabricating a conducting path through the structures; and
  connecting each inductor pattern serially to the inductor pattern above by the conducting path, such that a current flowing in the serially connected inductor patterns creates a reinforcing magnetic field in the magnetic material between adjacent inductor patterns.

38. The method of claim 37, wherein the substrate is a semiconductor.

39. The method of claim 37, wherein the magnetic material is a ferromagnetic.

40. The method of claim 37, wherein the insulating layer is silicon dioxide.

41. The method of claim 37, wherein the inductor pattern is a square spiral.

42. The method of claim 37, wherein the inductor pattern is a high-conductivity material.

43. A method of fabricating an inductor comprising:
  selecting a silicon substrate;
  depositing a layer of magnetic material on the substrate;
  depositing an insulating layer on the magnetic material layer;
  stacking a plurality of sandwich structures on the insulating layer, the method of fabricating the structures comprising:
    depositing an inductor pattern on the insulating layer and above the magnetic material layer;
    depositing an insulating layer on the inductor pattern;
    depositing a layer of magnetic material on the insulating layer and above the inductor pattern; and
    depositing an insulating layer on the magnetic material layer;
  fabricating a conducting path through the structures; and
  connecting each inductor pattern serially to the inductor pattern above by the conducting path, such that a current flowing in the serially connected inductor patterns creates a reinforcing magnetic field in the magnetic material between adjacent inductor patterns.

44. The method of claim 43, wherein the substrate is a semiconductor.

45. The method of claim 43, wherein the magnetic material is a ferromagnetic.

46. The method of claim 43, wherein the insulating layer is silicon dioxide.

47. The method of claim 43, wherein the inductor pattern is a square spiral.

48. The method of claim 43, wherein the inductor pattern is a high-conductivity material.

* * * * *